US011484936B2

(12) United States Patent
Tanaka et al.

(10) Patent No.: US 11,484,936 B2
(45) Date of Patent: *Nov. 1, 2022

(54) SEMICONDUCTOR-MOUNTING HEAT DISSIPATION BASE PLATE AND PRODUCTION METHOD THEREFOR

(71) Applicant: MITSUBISHI ELECTRIC CORPORATION, Tokyo (JP)

(72) Inventors: Keisuke Tanaka, Tokyo (JP); Daisuke Oya, Tokyo (JP); Mikio Ishihara, Tokyo (JP); Tatsuya Iwasa, Tokyo (JP); Koji Saito, Tokyo (JP); Yuki Wakabayashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 72 days.

This patent is subject to a terminal disclaimer.

(21) Appl. No.: 17/132,708

(22) Filed: Dec. 23, 2020

(65) Prior Publication Data
US 2021/0121943 A1    Apr. 29, 2021

Related U.S. Application Data

(63) Continuation of application No. 16/080,163, filed as application No. PCT/JP2017/019898 on May 29, 2017, now Pat. No. 10,898,946.

(30) Foreign Application Priority Data

Jun. 16, 2016    (JP) .................................. 2016-119439

(51) Int. Cl.
*B22C 3/00*    (2006.01)
*B22D 19/00*    (2006.01)
(Continued)

(52) U.S. Cl.
CPC ................. *B22C 3/00* (2013.01); *B22D 19/00* (2013.01); *B22D 27/18* (2013.01); *B22D 27/20* (2013.01);
(Continued)

(58) Field of Classification Search
CPC .......... B22C 3/00; B22D 19/00; B22D 27/18; B22D 27/20
(Continued)

(56) References Cited

U.S. PATENT DOCUMENTS

| 3,848,847 A | 11/1974 | Komatsu et al. |
| 5,614,043 A | 3/1997 | Ritland et al. |

(Continued)

FOREIGN PATENT DOCUMENTS

| CN | 101107707 A | 1/2008 |
| EP | 2 579 696 A1 | 4/2013 |

(Continued)

OTHER PUBLICATIONS

International Search Report (PCT/ISA/210) dated Aug. 8, 2017, by the Japanese Patent Office as the International Searching Authority for International Application No. PCT/JP2017/019898.
(Continued)

*Primary Examiner* — Kevin P Kerns
(74) *Attorney, Agent, or Firm* — Buchanan Ingersoll & Rooney PC

(57) ABSTRACT

In a semiconductor-mounting heat dissipation base plate including: an insulating substrate to which a metal circuit layer for mounting a semiconductor chip thereon is fixed; a heat dissipation base formed from the same metal material as the metal circuit layer at a side opposite to the metal circuit layer across the insulating substrate and fixed to the insulating substrate similar to the metal circuit layer; and a strengthening member provided in the heat dissipation base
(Continued)

so as to be separated from the insulating substrate, the sizes of crystal grains of a metal structure at a part of the heat dissipation base or the metal circuit layer are reduced by a crystal size reducing material adhered to a mold, thereby preventing an adverse effect of a columnar crystal structure.

19 Claims, 4 Drawing Sheets

(51) Int. Cl.
  *B22D 27/18*  (2006.01)
  *B22D 27/20*  (2006.01)
  *H01L 23/12*  (2006.01)
  *H01L 23/36*  (2006.01)
  *H05K 1/02*  (2006.01)
  *H01L 23/14*  (2006.01)
  *H01L 23/373*  (2006.01)

(52) U.S. Cl.
  CPC ............ *H01L 23/12* (2013.01); *H01L 23/142* (2013.01); *H01L 23/36* (2013.01); *H01L 23/3736* (2013.01); *H05K 1/02* (2013.01); *H05K 1/0203* (2013.01)

(58) Field of Classification Search
  USPC ............ 164/58.1, 72, 138, 75, 98, 100, 122, 164/122.1, 122.2
  See application file for complete search history.

(56) References Cited

U.S. PATENT DOCUMENTS

| | | | |
|---|---|---|---|
| 5,751,552 A | 5/1998 | Scanlan et al. | |
| 10,898,946 B2 * | 1/2021 | Tanaka et al. | ......... B22D 27/18 |
| 2003/0041436 A1 | 3/2003 | Kelly et al. | |
| 2005/0072547 A1 | 4/2005 | Osanai et al. | |
| 2005/0214518 A1 | 9/2005 | Nagase et al. | |
| 2007/0215895 A1 | 9/2007 | Amoh et al. | |
| 2007/0227685 A1 | 10/2007 | Sugawara et al. | |
| 2008/0122052 A1 | 5/2008 | Fukui | |
| 2010/0013086 A1 | 1/2010 | Obiraki et al. | |
| 2010/0206537 A1 | 8/2010 | Ikeda et al. | |
| 2011/0074010 A1 | 3/2011 | Kuromitsu | |
| 2012/0279761 A1 | 11/2012 | Hori et al. | |
| 2014/0035114 A1 | 2/2014 | Gogoi et al. | |
| 2015/0055302 A1 | 2/2015 | Nagatomo | |
| 2017/0352607 A1 | 12/2017 | Kooriyama et al. | |
| 2018/0005914 A1 | 1/2018 | Ogawa et al. | |

FOREIGN PATENT DOCUMENTS

| | | |
|---|---|---|
| JP | H09-315875 A | 12/1997 |
| JP | 2008253996 A | 10/2008 |
| JP | 2011166122 A | 8/2011 |
| JP | 2012-9787 A | 1/2012 |
| JP | 2012164709 A | 8/2012 |
| JP | 2013243181 A | 12/2013 |
| JP | 5478178 B2 | 4/2014 |
| KR | 10-2013-0000372 A | 1/2013 |
| WO | 2016098723 A1 | 5/2016 |
| WO | 2016121660 A1 | 8/2016 |

OTHER PUBLICATIONS

Written Opinion (PCT/ISA/237) dated Aug. 8, 2017, by the Japanese Patent Office as the International Searching Authority for International Application No. PCT/JP2017/019898.

Office Action (Notification of Reason for Refusal) dated Apr. 29, 2020, by the Korean Patent Office in corresponding Korean Patent Application No. 10-2018-7035504 and English translation of the Office Action. (9 pages).

Office Action dated May 15, 2020, by the German Patent Office in corresponding German Patent Application No. 112017002999.6 and English translation of the Office Action. (12 pages).

First Office Action dated Nov. 9, 2021, by the State Intellectual Property Office of People's Republic of China in corresponding Chinese Patent Application No. 201780029589.X and an English translation of the Office Action. (14 pages).

* cited by examiner

SEMICONDUCTOR-MOUNTING HEAT DISSIPATION BASE PLATE AND PRODUCTION METHOD THEREFOR

CROSS-REFERENCE TO RELATED APPLICATIONS

This application is a continuation application of U.S. patent application Ser. No. 16/080,163 filed on Aug. 27, 2018, now U.S. Pat. No. 10,898,946, which is a U.S. National Stage application of International Patent Application No. PCT/JP2017/019898 filed on May 29, 2017, which claims priority to Japanese Patent Application No. 2016-119439 filed on Jun. 16, 2016, the entire contents of all three of which are incorporated herein by reference in their entireties for all purposes.

TECHNICAL FIELD

The present invention relates to a semiconductor-mounting heat dissipation base plate and particularly relates to a semiconductor-mounting heat dissipation base plate produced by a casting technique and including a metal circuit layer and a heat dissipation base.

BACKGROUND ART

A technique has been known in which aluminum is cast so as to surround a ceramic, which is set within a carbon mold, when a metal-ceramic integrated substrate is produced by molten metal bonding.

As conventional art, in a ceramic insulating substrate for a power module, a metal circuit is formed on one side of a ceramic substrate, a base plate for forming a heat dissipation surface is formed on the other side thereof, and a power semiconductor chip is bonded on the metal circuit. In a practical use environment, such a substrate for a power module is integrally fixed to a housing component, which holds a terminal for supplying power to a power semiconductor therethrough or the like, by an adhesive or the like, and the base plate is fastened together with the housing component by means of bolts, screws, or the like.

In addition, in order to improve heat dissipation directly below the power semiconductor on the base plate, metallic heat dissipation fins are attached to the base plate by means of brazing or via heat dissipation grease. A metal-ceramic bonded substrate for a power module having such a configuration is produced by molten metal bonding as disclosed in Patent Document 1 in some cases. In molten metal bonding, a ceramic is placed in a mold, a molten metal is poured around the ceramic to insert-cast the ceramic, whereby a circuit pattern, the ceramic, and a heat dissipation base plate are integrally molded.

In addition, a technique has been known in which, as disclosed in Patent Document 2, an aluminum-silicon-based aluminum alloy layer is bonded to at least one surface of an insulating substrate, and in an electronic element-mounting substrate in which the diameters of metal crystal grains within an aluminum alloy layer are controlled, the sizes of the crystal grains are reduced, for example, thereby enhancing the breaking strength of the bonded interface between the insulating substrate and the aluminum alloy layer.

CITATION LIST

Patent Document

Patent Document 1: Japanese Patent No. 5478178
Patent Document 2: Japanese Laid-Open Patent Publication No. 2013-243181

SUMMARY OF THE INVENTION

Problems to be Solved by the Invention

When a metal for forming the metal circuit layer and the heat dissipation base is composed of so-called pure aluminum having a purity of about 99 to 99.9%, if the production method in Patent Document 1 is used, after molten metal bonding, due to directional solidification cooling from one of four sides, that is, from the downstream side of molten metal flow during molten metal bonding, a metal structure forms a coarse columnar crystal structure exceeding 2 to 3 cm and larger than a semiconductor chip, which is to be mounted on the metal circuit layer, from the downstream side toward the upstream side on the surface of the heat dissipation base.

Since the coarse columnar crystal structure is formed on the surface of the heat dissipation base, there is the following problem. When fastening holes for fastening the heat dissipation base together with another member are formed in a post process, if a crystal grain boundary of the columnar crystal structure is present across a fastening hole, the hole shape becomes distorted since resistance against a processing load during processing is different for each crystal orientation of the columnar crystal structure. Thus, for example, in fastening with a bolt and a nut, the area of contact of the nut decreases, and, when a necessary fastening load is applied, creep deformation occurs due to a temperature cycle during later practical use. Furthermore, due to the decrease in the area of contact, the bolt and the nut cannot withstand the fastening load and become loose.

In addition, when a columnar crystal structure is formed on the metal circuit layer, a problem relating to bonding with a semiconductor chip arises, and when a columnar crystal structure is formed on the heat dissipation surface of the heat dissipation base, the columnar crystal structure adversely affects heat dissipation characteristics.

The present invention is intended to regulate the diameters of crystal grains due to casting at the surface of a heat dissipation base or a metal circuit layer, thereby inhibiting generation of a columnar crystal structure on the heat dissipation base or the metal circuit layer and preventing an adverse effect of the columnar crystal structure.

The invention disclosed in Patent Document 2 is intended to regulate the diameters of crystal grains at the bonded interface between the insulating substrate and the aluminum layer and to enhance the bonding strength of the insulating substrate and the metal circuit layer, and thus the technical idea thereof is different from that of the present invention.

Solution to the Problems

A semiconductor-mounting heat dissipation base plate according to the present invention includes: an insulating substrate which is formed from a ceramic and to which a metal circuit layer mounting a conductor component thereon and formed from aluminum is fixed; and a heat dissipation base fixed to the insulating substrate at a side opposite to the metal circuit layer across the insulating substrate and formed from aluminum, wherein a crystal grain diameter regulated region in which crystal grain diameter is regulated is provided in at least a part of a surface of the heat dissipation base or the metal circuit layer.

In addition, a method for producing a semiconductor-mounting heat dissipation base plate according to the present invention is a method for producing a semiconductor-mounting heat dissipation base plate including: an insulating substrate which is formed from a ceramic and to which a metal circuit layer mounting a semiconductor component thereon and formed from aluminum is fixed by direct bonding through casting; and a heat dissipation base formed from aluminum and fixed to the insulating substrate at a side opposite to the metal circuit layer across the insulating substrate by direct bonding through casting, the method including adhering at least one or more types of a crystal grain size reducing material to a part of a cavity-side surface of a mold during casting of the heat dissipation base and the metal circuit layer, thereby forming a crystal grain diameter regulated region in which crystal grain diameter is regulated, in at least a part of a surface of the heat dissipation base or the metal circuit layer.

Effect of the Invention

According to the present invention, the diameters of crystal grains due to casting are regulated, whereby generation of a columnar crystal structure at the surface of the heat dissipation base or the metal circuit layer can be inhibited and an adverse effect of the columnar crystal structure can be prevented.

DESCRIPTION OF EMBODIMENTS

First Embodiment

Figure 1:
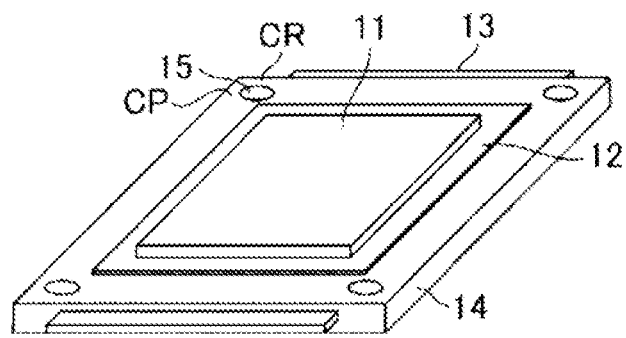
FIG. 1 is a perspective view showing the configuration of a semiconductor-mounting heat dissipation base plate according to a first embodiment of the present invention.
Figure 2:
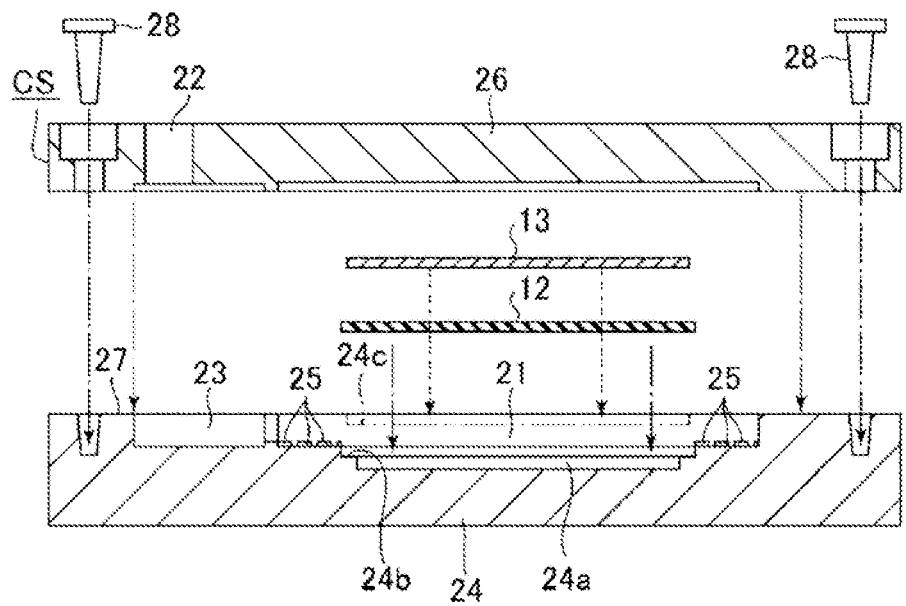
FIG. 2 is a side cross-sectional view showing assembling of a mold in the first embodiment of the present invention.
Figure 3:
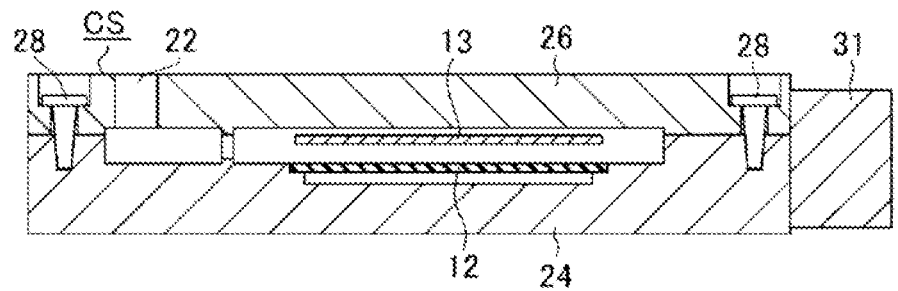
FIG. 3 is a side cross-sectional view showing a cooling step during casting in the first embodiment of the present invention.
Figure 4A:
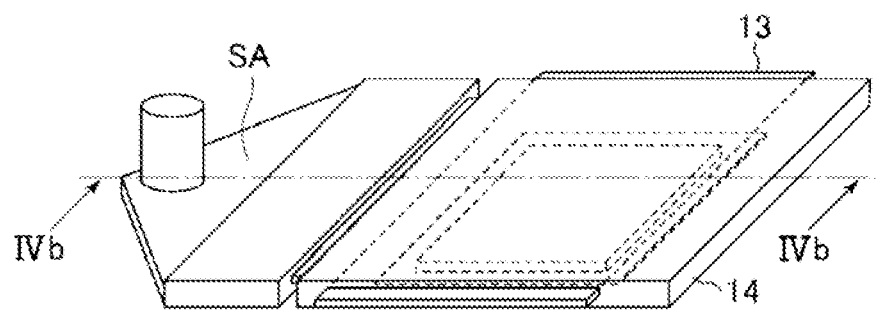
FIG. 4A shows a perspective view of the cast semiconductor-mounting heat dissipation base plate according to the first embodiment of the present invention.
Figure 4B:
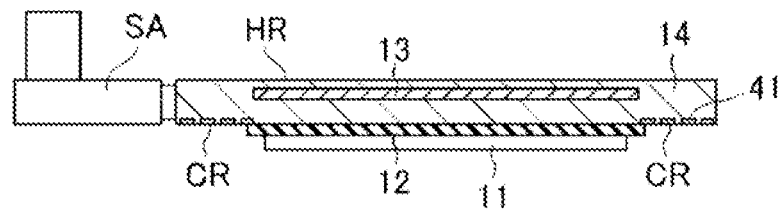
FIG. 4B shows a cross-sectional view taken along a line IVb-IVb in FIG. 4A.
Figure 5:
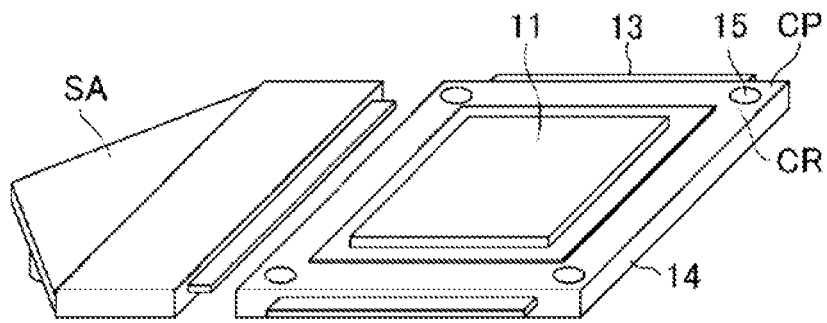
FIG. 5 is a perspective view showing forming bolt-fastening holes and cutting a runner in the first embodiment of the present invention.

A first embodiment of the present invention will be described with reference to FIGS. 1 to 5. FIG. 1 is a perspective view showing the configuration of a semiconductor-mounting heat dissipation base plate. FIG. 2 is a side cross-sectional view showing assembling of a mold. FIG. 3 is a side cross-sectional view showing a cooling step during casting. FIGS. 4A and 4B show the cast semiconductor-mounting heat dissipation base plate, FIG. 4A is a perspective view, and FIG. 4B is a cross-sectional view taken along a line IVb-IVb in FIG. 4A. FIG. 5 is a perspective view showing forming bolt-fastening holes and cutting a runner.

In FIG. 1 showing the configuration of the semiconductor-mounting heat dissipation base plate according to the first embodiment, the semiconductor-mounting heat dissipation base plate includes: an insulating substrate 12 to which a metal circuit layer 11 for mounting a semiconductor chip thereon is fixed to; and a heat dissipation base 14 in which a strengthening member 13 is provided and which is fixed to the insulating substrate 12 at the side opposite to the metal circuit layer 11 across the insulating substrate 12.

In the first embodiment, in a layer configuration in which aluminum having a thickness of 0.3 to 1.5 mm and a purity of 99 to 99.9% is used as the metal circuit layer 11, aluminum nitride having a thickness of 0.3 to 2 mm is used as the insulating substrate 12, aluminum nitride similar to that as the insulating substrate is used as the strengthening member 13, and a layer having a thickness of 1 to 5 mm is used as the heat dissipation base 14, a description will be given with a configuration in which bolt-fastening holes of 3 to 8 mm are provided as bolt-fastening holes 15 at four corners of the heat dissipation base 14. A fastening portion CP is formed by each bolt-fastening hole 15 and a portion surrounding the bolt-fastening hole 15.

The semiconductor-mounting heat dissipation base plate having these configurations is produced by a production process using a mold CS shown in FIGS. 2 and 3. For the mold CS for aluminum casting, graphite carbon which has continuous pores and excellent air permeability is used. For the purpose of preventing molten aluminum from reacting with the surface of the mold made of graphite carbon, a mold releasing film is formed on a cavity 21 portion for forming the semiconductor-mounting heat dissipation base plate and a pouring port 22 and a runner 23 of the mold CS by spraying boron nitride powder, which is diluted with a solvent such as dimethyl ether or methyl ethyl ketone, such that a film thickness is less than or equal to 100 μm.

Furthermore, at least one or more types of a known crystal grain size reducing material 25 for aluminum, such as a titanium-aluminum alloy, a titanium-aluminum-boron alloy, titanium diboride, aluminum diboride, tungsten carbide, tantalum carbide, and titanium carbide, are adhered to the mold releasing film on the cavity 21-side surface of a lower mold 24 other than a metal circuit layer 11-side surface for forming the metal circuit layer 11. For example, similar to the mold releasing film, the crystal grain size reducing material 25 is diluted with dimethyl ether or methyl ethyl ketone, agitated, and sprayed to the above target surface. The particle diameters of powder to be used as the crystal grain size reducing material 25 are preferably smaller. Here, powder having an average particle diameter that allows the powder to pass through a 200-mesh sieve during particle sizing is used. The crystal grain size reducing material is not limited thereto, and a plurality of types of the crystal grain size reducing material may be mixed, diluted with a solvent such as dimethyl ether or methyl ethyl ketone in a range of 2 to 10 wt %, and sprayed to the above target surface. In addition, as another adhering method, the crystal grain size reducing material may be applied to the mold surface by using a thermal spraying method, an ion plating method, or the like. Moreover, if cellulose or the like can be added to the solvent in an amount of about 0.5 to 1 wt % in order to improve the adhesion of the crystal grain size reducing material to the mold surface and if the crystal grain size reducing material can be thickly applied such that the thickness thereof is about 50 to 200 μm, even when the mold releasing film on the target surface is omitted and the crystal grain size reducing material is applied directly to the mold, an effect of reducing the sizes of aluminum crystal grains is achieved while reaction between the mold and aluminum is prevented.

The mold CS is divided into the lower mold 24 and an upper mold 26, and a cavity 21 is formed in a direction in which the metal circuit layer 11 is formed at a recess 24a provided on a bottom surface of the lower mold 24. A projection 24b for holding the insulating substrate 12 is disposed at the upper side of the metal circuit layer 11 in the lower mold 24, and a projection 24c for holding the strengthening member 13 is disposed at the upper side of the projection 24b along a division surface 27 of the lower mold 24 and the upper mold 26.

The insulating substrate 12 and the strengthening member 13 are placed with respect to the projections 24b and 24c. Thereafter, the upper mold 26 is covered, and the upper mold 26 and the lower mold 24 are fastened and fixed by means of bolts 28 for preventing mold opening. The mold for which the application of the mold releasing film, the application of the crystal grain size reducing material 25, placement of the insulating substrate 12 and the strengthening member 13, and fastening and fixing of the upper mold 26 and the lower mold 24 have been completed, is subjected to a casting process. In the casting process, for ensuring fluidity of molten aluminum within the mold CS, the mold CS is preheated to a temperature higher than or equal to the melting point of aluminum.

In order to prevent the mold body or molten aluminum from being oxidized along with the preheating of the mold CS, the mold CS is evacuated in a furnace in all steps of the casting process from a preheating step through a pouring step to a cooling step, and then the atmosphere in the furnace is replaced with an inert gas such as nitrogen or argon. In the mold CS preheated to the temperature higher than or equal to the melting point, in the pouring step, molten aluminum flows from the pouring port 22 through the runner 23 into the cavity 21. Slight water vapor coming out from aluminum, entrained voids generated during flow in the cavity 21, and the like are caused to flow by being pressed by pressure caused by molten metal supply, and are discharged out of the mold through the continuous pores of the graphite carbon or the division surface 27 of the upper mold 26 and the lower mold 24. After the cavity 21 of the mold CS is filled with the molten aluminum, a chiller 31 is brought into contact with a surface of the mold CS opposite to the surface of the mold CS close to the pouring port 22, thereby cooling the mold CS through so-called directional solidification in which cooling progresses from the final filling position in the cavity 21 toward the pouring port 22. The semiconductor-mounting heat dissipation base plate having undergone the cooling solidification step is shown in FIGS. 4A and 4B.

In the solidification procedure, in the configuration disclosed in Patent Document 1, primary crystals deposited at the chiller 31 side grow, and coarse columnar crystals are formed across the full length of the semiconductor-mounting heat dissipation base plate. On the other hand, in the present embodiment, since the crystal grain size reducing material 25 is adhered to the portion, of the cavity 21-side surface of the mold CS, corresponding to the metal circuit layer 11-side area of the heat dissipation base 14 other than the metal circuit layer 11, the crystal grain size reducing material 25 is dispersed as solidification nuclei in the molten aluminum before primary crystals are formed, and many equiaxial crystals 41 of about 0.5 to 3 mm are formed before coarse columnar crystals are formed by directional solidification. Thus, the diameters of crystal grains at the surface to which the crystal grain size reducing material 25 is adhered can be controlled to be smaller than those at a surface to which the crystal grain size reducing material 25 is not adhered. After the solidification is completed, the entire mold CS is cooled to approximately room temperature, the bolts 28 for preventing mold opening are removed to unfasten the upper mold 26 and the lower mold 24, the upper mold 26 and the lower mold 24 are separated from each other to open the mold, and the semiconductor-mounting heat dissipation base plate is taken out.

As shown in FIG. 4B, crystal grain diameter regulated regions CR in which the diameters of crystal grains due to casting are regulated are formed in the surfaces of portions, of the heat dissipation base 14, corresponding to the fastening portions CP including the fastening holes 15 at the four corners of the heat dissipation base 14. A heat dissipation surface HR is formed in the surface of the heat dissipation base 14 at the side opposite to the surface in which the crystal grain diameter regulated regions CR are formed.

As shown in FIGS. 4A and 4B, in the semiconductor-mounting heat dissipation base plate taken out from the mold CS, solidified aluminum SA which is a runner 23 portion is connected to an end surface of the heat dissipation base 14. Thus, as shown in FIG. 5, the aluminum SA, which is the runner 23 portion, is removed, and bolt-fastening holes 15 are formed in the crystal grain diameter regulated regions CR, which are provided at the four corners of the heat dissipation base 14.

There are two processing methods for the bolt-fastening holes 15 and for cutting the aluminum SA, which is the runner 23 portion. In the first method, a machining center or a CNC milling machine is used, the surfaces on which the strengthening member 13 is exposed are fixed by a vise or the like, and the crystal grain-size-reduced portions of the heat dissipation base plate are bored with a cutting tool such as a drill or an end mill. In addition, in the configuration in the present embodiment, although the crystal grain size reducing material 25 is used, since the metal for forming the heat dissipation base 14 is pure aluminum having a purity of 99 to 99.9%, it is necessary to use cutting oil for the reason that cutting dust is easily welded to the edge of a cutting tool to form a build-up edge, and for the purpose of lubrication and cooling. In addition, the runner 23 portion is cut by a cutting tool such as an end mill or a milling cutter.

The second method for forming the bolt-fastening holes 15 and cutting the runner 23 portion is plastic processing using a press mold. After positioning is performed at the surfaces on which the strengthening member 13 is exposed and the side surface of the heat dissipation base 14 at the chiller 31 side through the casting process, the runner 23 portion and the heat dissipation base 14 are cut while forming the bolt-fastening holes 15 by a punch and a die of the press mold in the surface of the heat dissipation base 14 at the metal circuit layer 11 side other than the metal circuit layer 11, at which surface the average crystal grain diameter is controlled to be less than or equal to 12 mm by the crystal grain size reducing material 25. Also, in processing for the bolt-fastening holes 15 using the press mold, press oil for the purpose of lubrication and cooling of the punch and the die during press processing is essential since formation of a build-up edge is a problem similar to the above cutting. These two means for forming the bolt-fastening holes 15 require use of cutting oil and press oil, respectively. In consideration of solder wettability of a nickel plating surface during later mounting of a semiconductor chip, highly volatile oil is desirably used as each of the cutting oil and the press oil. The aforementioned crystal grain diameter is a value calculated by dividing the length of a line segment by the number of crystal grains passing on the line segment, the line segment being drawn in a photographed region of any surface of a heat dissipation base photographed after crystal grain boundaries at the surface of the heat dissipation base is exposed by a method such as etching.

As described above, the configuration in the present invention is a semiconductor-mounting heat dissipation base plate including: the insulating substrate 12 to which the metal circuit layer 11 for mounting a semiconductor chip thereon is fixed by direct bonding; the heat dissipation base 14 formed from the same metal material as the metal circuit layer 11 at the side opposite to the metal circuit layer 11 across the insulating substrate 12 and fixed to the insulating substrate 12 by the direct bonding similar to the metal circuit layer 11; and the strengthening member 13 provided in the heat dissipation base 14 so as to be separated from the insulating substrate 12. The metal for forming the metal circuit layer 11 and the heat dissipation base 14 is so-called pure aluminum having a purity of about 99 to 99.9%. In the production method in Patent Document 1, after molten metal bonding, due to directional solidification cooling from one of four sides, that is, from the downstream side of molten metal flow during molten metal bonding, a metal structure forms a coarse columnar crystal structure exceeding 2 to 3 cm and larger than a semiconductor chip, which is to be mounted on the metal circuit layer, from the downstream side toward the upstream side.

Since the coarse columnar crystal structure is formed, there is the following problem. When the fastening holes 15 for fastening the heat dissipation base 14 together with another member are formed in a post process, if a crystal grain boundary of the columnar crystal structure is present across the fastening hole 15, the hole shape becomes distorted since resistance against a processing load during processing is different for each crystal orientation of the columnar crystal structure. Thus, for example, in fastening with a bolt and a nut, the area of contact of the nut decreases, and, when a necessary fastening load is applied, creep deformation occurs due to a temperature cycle during practical use. Furthermore, due to the decrease in the area of contact, the bolt and the nut cannot withstand the fastening load and become loose.

For the above problem, in the present invention, the coarse columnar crystal structure which is the metal structure at the surface including the bolt-fastening holes 15 is modified to a metal structure having a fine crystal grain diameter, thereby eliminating distortion during fastening hole processing.

As the components in the present invention, the semiconductor-mounting heat dissipation base plate includes: the insulating substrate 12 to which the metal circuit layer for mounting a semiconductor chip thereon is fixed by direct bonding; the heat dissipation base 14 formed from the same metal material as the metal circuit layer 11 at the side opposite to the metal circuit layer 11 across the insulating substrate 12 and fixed to the insulating substrate 12 by the direct bonding similar to the metal circuit layer 11; and the strengthening member 13 provided in the heat dissipation base 14 so as to be separated from the insulating substrate 12. The metal for forming the metal circuit layer 11 and the heat dissipation base 14 is aluminum having a purity of about 99 to 99.9%.

As the solution to the problem in the present invention, at least one type of the crystal grain size reducing material 25 for aluminum, such as a titanium-aluminum alloy, a titanium-aluminum-boron alloy, titanium diboride, aluminum diboride, tungsten carbide, tantalum carbide, and titanium carbide, is adhered to the mold surface in the step of forming the heat dissipation base 14 with respect to the coarse columnar crystal structure which is the metal structure at a part of the heat dissipation base surface including each fastening hole 15, whereby the crystal grain size reducing material 25 becomes solidification nuclei to be deposited earlier than directional solidification during formation of the heat dissipation base 14, that is, during casting solidification, and forms fine crystal grains and crystal grain boundaries in the metal structure.

In particular, as far as the present inventors have made an attempt, when a crystal grain size reducing material is applied in the same amount per unit area, a titanium-aluminum alloy has size-reduced crystal grains of aluminum more finely than titanium diboride or aluminum diboride. That is, in the case with the aim of achieving a predetermined average grain diameter, a titanium-aluminum alloy has an excellent effect of reducing the sizes of crystal grains, and the same effect is obtained with a small amount of the crystal grain size reducing material.

By making the coarse columnar crystal structure, which exceeds 2 to 3 cm and is the metal structure at the part of the heat dissipation base 14 including each fastening hole 15, into a fine structure by the solution to the problem, the metal structure around each fastening hole 15 becomes equiaxial crystals having random crystal orientations, so that the hole shape is inhibited from being distorted during processing for the fastening holes 15, and fastening hole formation which does not depend on variation in a solidification step is possible. Accordingly, variation in the areas of contact surfaces of the bolt and the nut with the periphery of each fastening hole 15 is eliminated, and thus the problem in which the heat dissipation base creeps to loosen the bolt and the nut can be solved even when a constant fastening force is applied. In addition, unlike size reduction of the crystal grains along with deformation by processing, the crystal grain size reducing material 25 that has not been used as solidification nuclei is unevenly deposited on the crystal grain boundaries in the metal structure, and thus initial crystal grains do not grow to increase their crystal grain diameters when being heated to a temperature higher than or equal to the recrystallization temperature in the case where a temperature cycle is applied during practical use. Therefore, fastening force by the bolt and the nut can be stably ensured over a long period of time.

The semiconductor-mounting heat dissipation base plate according to the first embodiment includes: the insulating substrate 12 which is formed from a ceramic and to which the metal circuit layer 11 formed from aluminum having a purity of 99 to 99.9% and mounting thereon a semiconductor component composed of a semiconductor chip is fixed by direct bonding through casting; the heat dissipation base 14 which is formed from the same metal material as the metal circuit layer 11 at the side opposite to the metal circuit layer 11 across the insulating substrate 12, is fixed to the insulating substrate 12 by direct bonding through casting similar to the metal circuit layer 11, and is formed from aluminum having a purity of 99 to 99.9%; and the fastening portion CP formed by each fastening hole 15 provided in the heat dissipation base 14 and a portion surrounding the fastening hole 15, and a crystal grain diameter regulated region CR in which an average crystal grain diameter is less than or equal to 12 mm is provided in the surface of the heat dissipation base 14 including at least the surface of the fastening portion CP. Here, the average crystal grain diameter in the crystal grain diameter regulated region is smaller than the average crystal grain diameter in the other regions of the metal circuit layer 11 and the heat dissipation base 14.

Accordingly, generation of a columnar crystal structure at the surface of the fastening portion provided in the heat dissipation base is inhibited by regulating the diameters of crystal grains due to casting, and thus an adverse effect of the columnar crystal structure on fastening action can be prevented.

In addition, the semiconductor-mounting heat dissipation base plate according to the first embodiment is configured as a semiconductor-mounting heat dissipation base plate including: the insulating substrate 12 to which the metal circuit layer 11 for mounting thereon a semiconductor component composed of a semiconductor chip is fixed by direct bonding; the heat dissipation base 14 formed from the same metal material as the metal circuit layer 11 at the side opposite to the metal circuit layer across the insulating substrate 12 and fixed to the insulating substrate 12 by direct bonding similar to the metal circuit layer 11; and the strengthening member 13 provided in the heat dissipation base 14 so as to be separated from the insulating substrate 12, wherein the metal for forming the metal circuit layer 11 and the heat dissipation base 14 is so-called pure aluminum having a purity of about 99 to 99.9%, a ceramic plate formed from aluminum nitride, aluminum oxide, silicon carbide, or the like is used as each of the insulating substrate 12 and the strengthening member 13, and an average crystal grain diameter at the outermost surface of the heat dissipation base 14 at the metal circuit layer 11 side, at which the semiconductor component is to be mounted, other than the metal circuit layer 11 is less than or equal to 12 mm.

Owing to this configuration, by setting the average crystal grain diameter at the outermost surface of the heat dissipation base at the metal circuit layer side other than the metal circuit layer to be less than or equal to 12 mm, high-quality fastening holes for which distortion or variation of a hole shape depending on crystal grain diameter is inhibited during fastening hole formation can be provided.

A method for producing the semiconductor-mounting heat dissipation base plate according to the first embodiment is a method for producing the semiconductor-mounting heat dissipation base plate described in the paragraph with the previous paragraph number, wherein, at least one type of the crystal grain size reducing material 25 for aluminum, such as a titanium-aluminum alloy, a titanium-aluminum-boron alloy, titanium diboride, aluminum diboride, tungsten carbide, tantalum carbide, and titanium carbide, is adhered to the portion, of the cavity 21-side surface of the mold, opposing the area of the heat dissipation base 14 at the metal circuit layer 11 side other than the metal circuit layer 11, whereby, in a cooling step during casting for forming a metal portion of the heat dissipation base 14, aluminum crystal grains of a metal structure at the outermost surface of the heat dissipation base 14 at the metal circuit layer 11 side other than the metal circuit layer 11 are inhibited from becoming coarse columnar crystals.

Accordingly, by inhibiting the aluminum crystal grains, which depend on variation in a cooling rate in directional solidification in the cooling step during casting and are difficult to control, from becoming coarse columnar crystals, the average crystal grain diameter at the outermost surface of the heat dissipation base at the metal circuit layer side, at which a semiconductor component is to be mounted, other than the metal circuit layer is controlled to be less than or equal to 12 mm, and the same advantageous effect as described in the paragraph with the previous paragraph number can be obtained.

A production device for the semiconductor-mounting heat dissipation base plate according to the first embodiment is a production device for the semiconductor-mounting heat dissipation base plate described in the paragraph with the paragraph number immediately before the previous paragraph number, the production device being a mold device: which includes the pouring port 22 for pouring molten metal, at a side close to one surface of a rectangular graphite, has a contact surface with the chiller 31 at a side opposite to the pouring port 22 side of the mold CS, includes a plurality of the cavities 21 formed by engraving the shape of the heat dissipation base 14, between the pouring port 22 of the mold CS and the chiller 31, each cavity 21 including positioning portions for positioning the insulating substrate 12 and the strengthening member 13, respectively, and includes the lower mold 24 having the positioning portions and the upper mold 26 having no positioning portion; and which is used in a casting process of forming a metal portion of the semiconductor-mounting heat dissipation base plate having the crystal grain size reducing material 25 adhered to a surface thereof at which an average crystal grain diameter is desired to be controlled to be less than or equal to 12 mm, in a state where the insulating substrate 12 and the strengthening member 13 are placed with respect to the lower mold 24 such that the insulating substrate 12 is closer to the bottom surface of the lower mold 24, the strengthening member 13 is placed so as to be separated from the insulating substrate 12, molten metal flows therebetween during casting to form the heat dissipation base 14 between the insulating substrate 12 and the strengthening member 13, and a mold releasing material such as boron nitride or zirconium oxide is applied before the crystal grain size reducing material 25 is adhered.

Accordingly, by adhering the crystal grain size reducing material to a partial selected region of the mold CS, the crystal grain size at the metal portion of the semiconductor-mounting heat dissipation base plate is selectively controlled to be less than or equal to 12 mm, and thus it is possible to inhibit crystal grains from becoming coarse columnar crystals.

Second Embodiment

Figure 6:
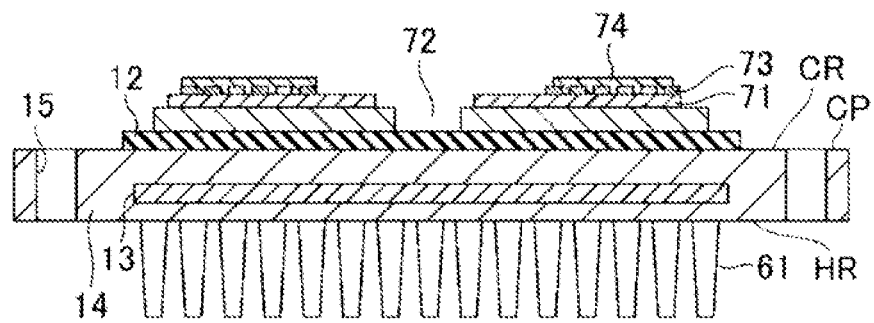
FIG. 6 is a side view of the configuration of a semiconductor-mounting heat dissipation base plate integrated with columnar heat dissipation fins according to a second embodiment of the present invention.

A second embodiment of the present invention will be described with reference to FIG. 6. FIG. 6 is a side view showing the configuration of a semiconductor-mounting heat dissipation base plate integrated with columnar heat dissipation fins.

The heat dissipation surface HR of the heat dissipation base 14 has been illustrated as a planar surface in the first embodiment. However, as illustrated in the second embodiment, there is also a configuration in which multiple columnar heat dissipation fins 61 having a root diameter of about 1 to 5 mm and a tip diameter of about 0.8 to 4 mm are arranged in a staggered manner.

In FIG. 6 showing the configuration of the semiconductor-mounting heat dissipation base plate according to the second embodiment, a metal circuit layer 11 for mounting a semiconductor chip 74 thereon is fixed to a heat dissipation base 14, in which a strengthening member 13 is provided, with an insulating substrate 12 interposed therebetween, and the multiple columnar heat dissipation fins 61 are arranged in a staggered manner on the lower surface of the heat dissipation base 14 which forms the heat dissipation surface HR of the heat dissipation base 14.

A circuit pattern groove 72 is formed in the metal circuit layer 11 fixed to the upper surface of the heat dissipation base 14 with the insulating substrate 12 interposed therebetween, and a semiconductor component composed of the semiconductor chip 74 is mounted via a nickel plating 71 and a solder 73.

The semiconductor-mounting heat dissipation base plate according to the second embodiment includes: the insulating substrate 12 which is formed from a ceramic and to which the metal circuit layer 11 formed from aluminum having a purity of 99 to 99.9% and mounting thereon the semiconductor component composed of the semiconductor chip 74 is fixed by direct bonding through casting; the heat dissipation base 14 which is formed from the same metal material as the metal circuit layer 11 at the side opposite to the metal circuit layer 11 across the insulating substrate 12, is fixed to the insulating substrate 12 by direct bonding through casting similar to the metal circuit layer 11, is formed from aluminum having a purity of 99 to 99.9%, and has the multiple columnar heat dissipation fins 61 arranged on the heat dissipation surface HR in a staggered manner; and a fastening portion CP formed by each fastening hole 15 provided in the heat dissipation base 14 and a portion surrounding the fastening hole 15, and a crystal grain diameter regulated region CR in which an average crystal grain diameter is less than or equal to 12 mm is provided in the surface of the heat dissipation base 14 including at least the surface of the fastening portion CP.

Owing to this configuration, regarding the heat dissipation base having the multiple columnar heat dissipation fins arranged in a staggered manner thereon, generation of a columnar crystal structure at the surface of the fastening portion provided in the heat dissipation base is inhibited by regulating the diameters of crystal grains due to casting, and thus an adverse effect of the columnar crystal structure on fastening action can be prevented.

Third Embodiment

Figure 7A:
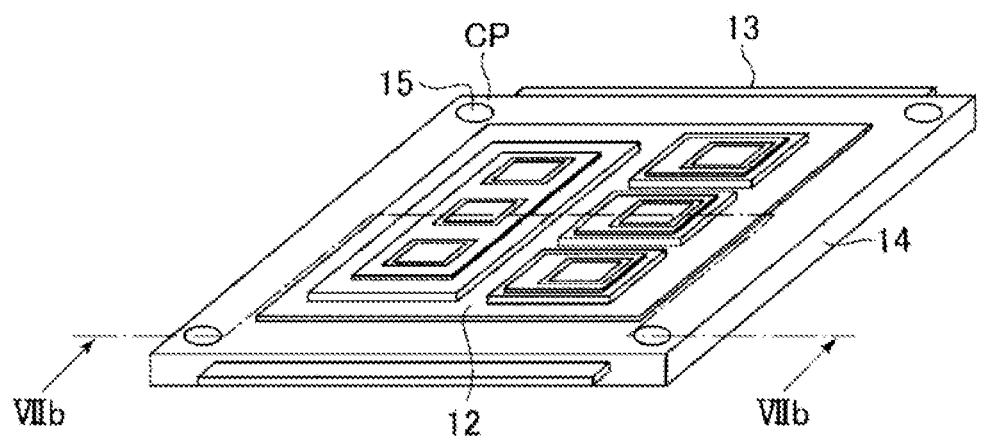
FIG. 7A shows a perspective view showing a mounted state of a semiconductor according to a third embodiment of the present invention.
Figure 7B:
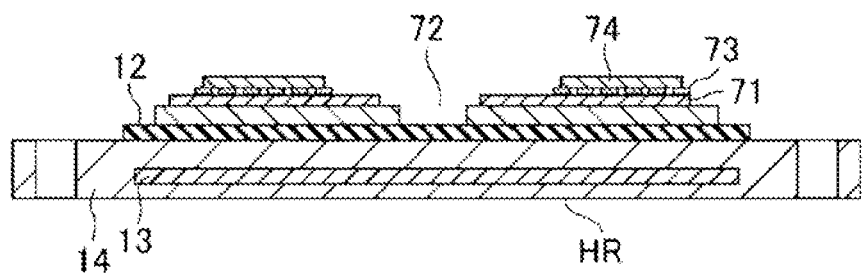
FIG. 7B shows a cross-sectional view taken along a line VIIb-VIIb in FIG. 7A.
Figure 8:
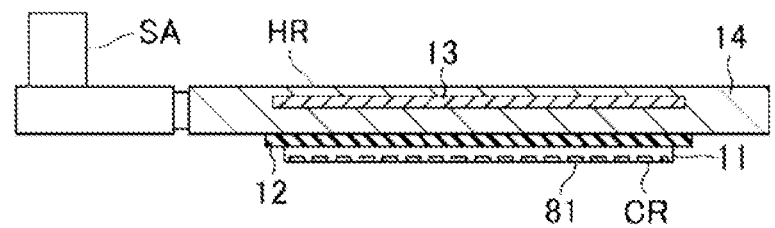
FIG. 8 is a side view showing the configuration of a semiconductor-mounting heat dissipation base plate according to the third embodiment of the present invention in which the structure of a metal circuit layer is made into a fine structure.

A third embodiment of the present invention will be described with reference to FIG. 7A, 7B and FIG. 8. FIGS. 7A and 7B show a mounted state of a semiconductor; FIG. 7A is a perspective view, and a FIG. 7B is a side view. FIG. 8 is a side view showing a semiconductor-mounting heat dissipation base plate in which the structure of a metal circuit layer is made into a fine structure.

In the configuration in Patent Document 1, crystal grain boundaries of coarse columnar crystals are deposited across the full length of the heat dissipation base or the metal circuit layer. In the metal circuit layer, an electrolytic or electroless nickel plating 71 having a film thickness of 4 to 30 μm is formed on aluminum of the coarse columnar crystals by zinc conversion, and a predetermined circuit pattern groove 72 is further formed in the metal circuit layer by etching. Moreover, a semiconductor chip having a thickness of 60 to 1000 μm is mounted on the nickel plating by means of a solder 73.

In addition, in a later assembling step, an aluminum wire may be bonded to the upper surface of the semiconductor chip, or a copper terminal having a thickness of 0.5 to 2 mm may be soldered to the upper surface of the semiconductor chip. Among these cases, in a configuration in which the semiconductor chip thickness is relatively small and a copper terminal is soldered to the upper surface of the semiconductor chip, when crystal grain boundaries of coarse columnar crystals are present directly below a position where the semiconductor chip is mounted, since each crystal grain has a different crystal orientation, each crystal grain greatly and repeatedly expands and contracts from the crystal grain boundary as a starting point due to a temperature cycle or the like in a practical use environment, and great bending stress is applied to the mounted semiconductor chip, whereby the semiconductor chip may be broken or separation may occur at the interface between the semiconductor chip and the metal circuit layer. In order to avoid such a quality defect, a step of inspecting presence/absence of crystal grain boundaries of coarse columnar crystals below the nickel plating on the semiconductor chip mounting surface and eliminating the crystal grain boundaries is required.

In addition, also in a configuration in which the semiconductor chip is relatively thick and has rigidity that is resistant to bending stress caused by deformation of aluminum due to a temperature cycle, there is a possibility that thermal resistance in a heat dissipation path from the semiconductor chip to the heat dissipation base is increased by occurrence of minute voids or separation due to repeated deformation of a solder layer between the nickel plating and the semiconductor chip. These problems related to long-term reliability of the semiconductor-mounting heat dissipation base plate can be solved by the configuration in the present embodiment.

In the first embodiment, the portion to which the crystal grain size reducing material is adhered is the portion of the heat dissipation base at the metal circuit layer side other than the metal circuit layer. However, as an example in the present embodiment, by evenly adhering and applying a crystal grain size reducing material 25 to the surface, of a mold CS, corresponding to a metal circuit layer 11, the crystal grain size reducing material 25 adhered to the metal circuit layer 11 becomes solidification nuclei to deposit equiaxial crystals 81 having an average crystal grain diameter of 12 mm or less from the outermost surface of the metal circuit layer, earlier than when primary crystals are deposited from the chiller 31 side of the mold CS and coarse columnar crystals are formed by directional solidification, in a cooling step of a casting process. The crystal grain diameter of aluminum forming the metal circuit layer 11 is reduced, and each crystal grain has a random crystal orientation, whereby the amount of expansion and contraction of each crystal grain due to a temperature cycle during practical use is reduced and bending stress generated in the semiconductor chip is reduced, so that breakage of the semiconductor chip can be prevented. In addition, similarly, the amount of deformation of the solder layer between the semiconductor chip and the nickel plating is reduced, so that an increase in thermal resistance due to occurrence of voids or separation of the solder is inhibited, and a semiconductor-mounting heat dissipation base plate having high reliability and long life can be provided.

The semiconductor-mounting heat dissipation base plate according to the third embodiment is configured as a semiconductor-mounting heat dissipation base plate including: an insulating substrate 12 to which the metal circuit layer 11 for mounting thereon a semiconductor component composed of a semiconductor chip 74 is fixed by direct bonding; a heat dissipation base 14 formed from the same metal material as the metal circuit layer 11 at the side opposite to the metal circuit layer 11 across the insulating substrate 12 and fixed to the insulating substrate 12 by direct bonding similar to the metal circuit layer 11; and a strengthening member 13 provided in the heat dissipation base 14 so as to be separated from the insulating substrate 12, wherein the metal for forming the metal circuit layer 11 and the heat dissipation base 14 is so-called pure aluminum having a purity of about 99 to 99.9%, a ceramic plate formed from aluminum nitride, aluminum oxide, silicon carbide, or the like is used as each of the insulating substrate 12 and the strengthening member 13, and an average crystal grain diameter at the outermost surface of the metal circuit layer 11 is less than or equal to 12 mm.

Owing to this configuration, by setting the average crystal grain diameter at the outermost surface of the metal circuit layer 11 to be less than or equal to 12 mm, the amount of thermal expansion of each crystal grain from a crystal grain boundary as a starting point due to a temperature cycle during practical use is different, so that there is an effect of inhibiting bending stress in the semiconductor chip 74 bonded on the metal circuit layer 11 from occurring to break the semiconductor chip 74 or inhibiting a defect of separation of the interface between the semiconductor chip 74 and the metal circuit layer 11 from occurring.

A method for producing the semiconductor-mounting heat dissipation base plate according to the third embodiment is a method for producing the semiconductor-mounting heat dissipation base plate described in the paragraph with the previous paragraph number, wherein at least one type of the crystal grain size reducing material 25 for aluminum, such as a titanium-aluminum alloy, a titanium-aluminum-boron alloy, titanium diboride, aluminum diboride, tungsten carbide, tantalum carbide, and titanium carbide, is adhered to a portion of a surface, of a mold, opposing the metal circuit layer 11, the portion corresponding to a portion of the outermost surface of the metal circuit layer 11 at which an average crystal grain diameter is desired to be less than or equal to 12 mm. By adhering the crystal grain size reducing material to the surface, of the mold, corresponding to the metal circuit layer 11, aluminum crystal grains of the metal circuit layer 11 are inhibited from becoming coarse columnar crystals in a cooling step during casting for forming a metal portion of the metal circuit layer 11.

Accordingly, by inhibiting the aluminum crystal grains, which depend on variation in a cooling rate in directional solidification in the cooling step during casting and are difficult to control, from becoming coarse columnar crystals, the average crystal grain diameter at the outermost surface of the heat dissipation base at the metal circuit layer side on which a semiconductor component is to be mounted is controlled to be less than or equal to 12 mm, and the advantageous effect described in the paragraph with the previous paragraph number can be obtained.

Fourth Embodiment

Figure 9:
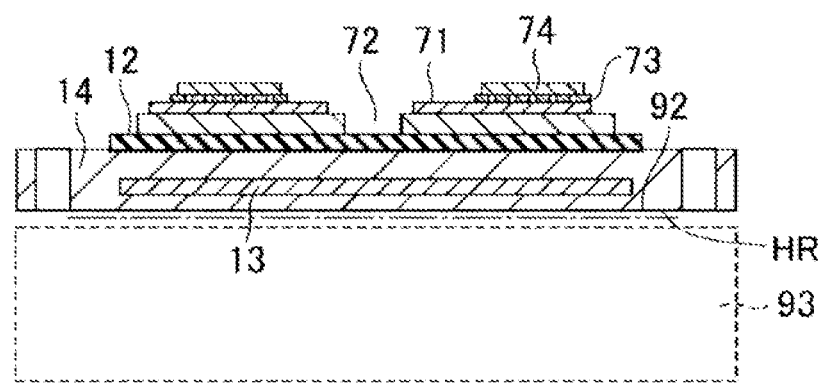
FIG. 9 is a side view showing an attached state of a semiconductor-mounting heat dissipation base plate according to a fourth embodiment of the present invention.
Figure 10:
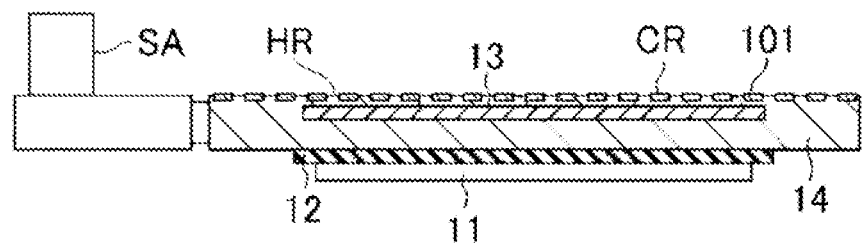
FIG. 10 is a side view showing the configuration of the semiconductor-mounting heat dissipation base plate according to the fourth embodiment of the present invention in which the structure of a heat dissipation surface is made into a fine structure.

A fourth embodiment of the present invention will be described with reference to FIG. 9 and FIG. 10. FIG. 9 is a side view showing an attached state of a semiconductor-mounting heat dissipation base plate. FIG. 10 is a side view showing the semiconductor-mounting heat dissipation base plate in which the structure of a heat dissipation surface is made into a fine structure.

A general problem of a semiconductor-mounting heat dissipation base plate is deformation of the semiconductor-mounting heat dissipation base plate by warpage which occurs due to a difference in linear expansion coefficient of each member when respective members such as a semiconductor chip, a metal circuit layer having excellent electric conductivity and thermal conductivity, an insulating substrate formed from a ceramic having excellent electric insulation, and a heat dissipation base plate having excellent thermal conductivity are soldered or directly bonded as in the present embodiment. Regarding the deformation, a warpage direction and a warpage amount are varied depending on balance between the thicknesses of the respective members, the linear expansion coefficients of the respective members, and the bonding strength between the respective members, and the warpage amount changes depending on a temperature cycle during practical use.

In a configuration in which a heat dissipation surface HR is planar, heat dissipation grease 92 having high thermal conductivity is applied to the heat dissipation surface HR of a heat dissipation base 14, and the heat dissipation surface HR is brought into contact with a cooling device 93 such as heat dissipation fins or a heat pipe for use. Thus, when the flatness of the initial heat dissipation surface HR is low, contact thermal resistance is high and heat dissipation deteriorates.

Similarly, when a warpage amount changes with time due to a temperature cycle during practical use, the heat dissipation grease flows between the contact surfaces of the heat dissipation surface HR of the heat dissipation base 14 and the cooling device in accordance with deformation of the heat dissipation base by warpage, and a pump-out phenomenon in which voids are generated in the heat dissipation grease occurs, so that the contact thermal resistance increases as compared to that in the initial stage and heat dissipation deteriorates. Finally, as a result of deterioration of heat dissipation, there is an increased possibility that the semiconductor chip that generates heat during driving thereof cannot be sufficiently cooled, resulting in breakage of the chip.

In the configuration in the present embodiment, the semiconductor-mounting heat dissipation base plate includes: an insulating substrate 12 to which a metal circuit layer 11 for mounting a semiconductor chip 74 thereon is fixed by direct bonding; a heat dissipation base 14 formed from the same metal material as the metal circuit layer 11 at the side opposite to the metal circuit layer 11 across the insulating substrate 12 and fixed to the insulating substrate 12 by direct bonding similar to the metal circuit layer 11; and a strengthening member 13 provided in the heat dissipation base 14 so as to be separated from the insulating substrate 12, wherein at least the metal for forming the metal circuit layer 11 and the heat dissipation base 14 is so-called pure aluminum having a purity of about 99 to 99.9%, a ceramic plate formed from aluminum nitride, aluminum oxide, silicon carbide, or the like is used as each of the insulating substrate 12 and the strengthening member 13, and an average crystal grain diameter at the heat dissipation surface HR at the side opposite to the metal circuit layer 11 across the strengthening member 13 embedded in the heat dissipation base 14 is less than or equal to 12 mm. The crystal grain size reducing material 25 is adhered to a target surface of the mold CS (see FIG. 2, FIG. 3), thereby reducing the sizes of crystal grains at the heat dissipation surface.

In particular, in the first embodiment, in the layer configuration in which aluminum having a thickness of 0.3 to 1.5 mm and a purity of 99 to 99.9% is used as the metal circuit layer 11, aluminum nitride having a thickness of 0.4 to 1.5 mm is used as the insulating substrate 12, aluminum nitride similar to that as the insulating substrate 12 is used as the strengthening member 13, and a layer having a thickness of 1 to 5 mm is used as the heat dissipation base 14, an initial warpage amount after casting is about 120 μm or less. However, in the configuration in the present embodiment, by controlling the crystal grain diameter at the heat dissipation surface HR using the crystal grain size reducing material 25, coarse columnar crystals formed across the full length of the heat dissipation surface HR are reduced in size to equiaxial crystals 101 having an average crystal grain diameter of 12 mm or less, and each crystal grain is randomly oriented. Thus, an amount of deformation when the heat dissipation surface HR expands and contracts due to a temperature cycle during practical use is reduced. As a result, an initial warpage amount of the heat dissipation surface HR after casting is about 80 μm or less.

In addition, as a problem specific to the configuration in which the metal circuit layer and the insulating substrate, the insulating substrate and the heat dissipation base, and the strengthening member embedded in the heat dissipation base so as to be separated from the insulating substrate are directly bonded through casting in Patent Document 1 or the first or second embodiment, deformation by warpage during a temperature rise due to a temperature cycle during practical use partially remains as permanent distortion, whereby an amount of deformation accumulates each time a temperature rise and a temperature fall are repeated. By reducing the sizes of coarse columnar crystals at the heat dissipation surface into equiaxial crystals in the present embodiment, the accumulated amount of deformation due to the temperature cycle can be reduced.

The semiconductor-mounting heat dissipation base plate according to the fourth embodiment is configured as a semiconductor-mounting heat dissipation base plate including: the insulating substrate 12 to which the metal circuit layer 11 for mounting thereon a semiconductor component composed of the semiconductor chip 74 is fixed by direct bonding; the heat dissipation base 14 formed from the same metal material as the metal circuit layer 11 at the side opposite to the metal circuit layer 11 across the insulating substrate 12 and fixed to the insulating substrate by direct bonding similar to the metal circuit layer; and the strengthening member 13 provided in the heat dissipation base 14 so as to be separated from the insulating substrate 12, wherein the metal for forming the metal circuit layer 11 and the heat dissipation base 14 is so-called pure aluminum having a purity of about 99 to 99.9%, a ceramic plate formed from aluminum nitride, aluminum oxide, silicon carbide, or the like is used as each of the insulating substrate 12 and the strengthening member 13, and an average crystal grain diameter at the heat dissipation surface at the side opposite to the metal circuit layer 11 across the strengthening member 13 embedded in the heat dissipation base 14 is less than or equal to 12 mm.

Owing to this configuration, by inhibiting the aluminum crystal grains, which depend on variation in a cooling rate in directional solidification in the cooling step during casting and are difficult to control, from becoming coarse columnar crystals, the average crystal grain diameter at the outermost surface that is the heat dissipation surface of the heat dissipation base is controlled to be less than or equal to 12 mm, and an effect of preventing the flatness of the heat dissipation surface of the semiconductor-mounting heat dissipation base plate from deteriorating as a temperature cycle is applied during practical use is achieved.

A method for producing the semiconductor-mounting heat dissipation base plate according to the fourth embodiment is a method for producing the semiconductor-mounting heat dissipation base plate described in the paragraph with the previous paragraph number, wherein at least one type of the crystal grain size reducing material 25 for aluminum, such as a titanium-aluminum alloy, a titanium-aluminum-boron alloy, titanium diboride, aluminum diboride, tungsten carbide, tantalum carbide, and titanium carbide, is adhered to a portion of a surface of a mold on which the insulating substrate 12 and the strengthening member 13 are placed, the surface being a surface opposing the heat dissipation base 14 at the side opposite to the insulating substrate 12, the portion opposing a portion of the outermost surface of the heat dissipation base 14 at which an average crystal grain diameter is desired to be less than or equal to 12 mm. By adhering the crystal grain size reducing material to the surface of the mold, corresponding to the heat dissipation surface, aluminum crystal grains of the metal structure at the heat dissipation surface are inhibited from becoming coarse columnar crystals in a cooling step during casting for forming a metal portion of the heat dissipation base 14.

It is noted that within the scope of the present invention, part or all of the above embodiments may be freely combined with each other, or each of the above embodiments may be modified or simplified as appropriate.

DESCRIPTION OF THE REFERENCE CHARACTERS 11 metal circuit layer
12 insulating substrate
13 strengthening member
14 heat dissipation base
15 bolt-fastening hole
21 cavity
22 pouring port
23 runner
25 crystal grain size reducing material
26 upper mold
27 division surface
28 bolt
31 chiller
41 equiaxial crystal
61 heat dissipation fin
71 nickel plating
72 circuit pattern groove
73 solder
81 equiaxial crystal
HR heat dissipation surface
92 heat dissipation grease
93 cooling device
101 equiaxial crystal

The invention claimed is:

1. A method for producing a semiconductor-mounting heat dissipation base plate including: an insulating substrate which is formed from a ceramic and to which a metal circuit layer for mounting a semiconductor component thereon and formed from aluminum is fixed by direct bonding through casting; and a heat dissipation base formed from aluminum and fixed to the insulating substrate at a side opposite to the metal circuit layer across the insulating substrate by direct bonding through casting, the method comprising adhering at least one or more types of a crystal grain size reducing material to a part of a cavity-side surface of a mold during casting of the heat dissipation base and the metal circuit layer, thereby forming a crystal grain diameter regulated region in which crystal grain diameter is regulated, in at least a part of a surface of the heat dissipation base or the metal circuit layer.

2. The method for producing the semiconductor-mounting heat dissipation base plate according to claim 1, wherein the crystal grain diameter regulated region is selectively formed at an outermost surface side of the metal circuit layer.

3. The method for producing the semiconductor-mounting heat dissipation base plate according to claim 2, wherein at least one of boron nitride or zirconium oxide is applied before the crystal grain size reducing material is adhered.

4. The method for producing the semiconductor-mounting heat dissipation base plate according to claim 2, wherein the crystal grain size reducing material is adhered by spray application.

5. The method for producing the semiconductor-mounting heat dissipation base plate according to claim 4, wherein the crystal grain size reducing material is diluted with dimethyl ether or methyl ethyl ketone and agitated before the spray application.

6. The method for producing the semiconductor-mounting heat dissipation base plate according to claim 2, wherein the crystal grain size reducing material is a titanium-aluminum alloy.

7. The method for producing the semiconductor-mounting heat dissipation base plate according to claim 2, wherein at least one or more types of crystal grain size reducing material are adhered to a part of the cavity-side surface of the mold in casting, the part opposing the metal circuit layer.

8. The method for producing the semiconductor-mounting heat dissipation base plate according to claim 2, wherein at least one or more types of crystal grain size reducing material are adhered to a part of the cavity-side surface of the mold in casting, the part opposing a heat dissipation surface of the heat dissipation base.

9. The method for producing the semiconductor-mounting heat dissipation base plate according to claim 1, wherein at least one of boron nitride or zirconium oxide is applied before the crystal grain size reducing material is adhered.

10. The method for producing the semiconductor-mounting heat dissipation base plate according to claim 1, wherein the heat dissipation base further includes a strengthening member.

11. The method for producing the semiconductor-mounting heat dissipation base plate according to claim 1, wherein the crystal grain size reducing material is adhered by spray application.

12. The method for producing the semiconductor-mounting heat dissipation base plate according to claim 11, wherein the crystal grain size reducing material is diluted with dimethyl ether or methyl ethyl ketone and agitated before the spray application.

13. The method for producing the semiconductor-mounting heat dissipation base plate according to claim 1, wherein the crystal grain size reducing material is adhered by a thermal spraying method.

14. The method for producing the semiconductor-mounting heat dissipation base plate according to claim 1, wherein the crystal grain size reducing material is adhered by an ion plating method.

15. The method for producing the semiconductor-mounting heat dissipation base plate according to claim 1, wherein the crystal grain size reducing material is a titanium-aluminum alloy.

16. The method for producing the semiconductor-mounting heat dissipation base plate according to claim 1, wherein at least one or more types of crystal grain size reducing material are adhered to a part of the cavity-side surface of the mold in casting, the part opposing the metal circuit layer.

17. The method for producing the semiconductor-mounting heat dissipation base plate according to claim 1, wherein at least one or more types of crystal grain size reducing material are adhered to a part of the cavity-side surface of the mold in casting, the part opposing a heat dissipation surface of the heat dissipation base.

18. A method for producing a semiconductor-mounting heat dissipation base plate including: an insulating substrate which is formed from a ceramic and to which a metal circuit layer for mounting a semiconductor component thereon and formed from aluminum is fixed by direct bonding through casting; and a heat dissipation base formed from aluminum and fixed to the insulating substrate at a side opposite to the metal circuit layer across the insulating substrate by direct bonding through casting, the method comprising:

adhering, during casting, at least one or more types of a crystal grain size reducing material to a part, opposing the metal circuit layer, of a cavity-side surface of a mold, a shape of the heat dissipation base being engraved on the cavity-side surface;

placing the insulating substrate at a first positioning portion of a cavity of the mold; and injecting molten aluminum into the mold.

19. The method for producing the semiconductor-mounting heat dissipation base plate according to claim 18, further comprising placing a strengthening member at a second positioning portion of the cavity such that the strengthening member is spaced apart from the insulating substrate.

* * * * *